United States Patent
Narita et al.

[11] Patent Number: 5,285,087
[45] Date of Patent: Feb. 8, 1994

[54] HETEROJUNCTION FIELD EFFECT TRANSISTOR

[75] Inventors: Koichi Narita; Kazuo Hayashi; Takuji Sonoda, all of Itami, Japan

[73] Assignee: Mitsubishi Denki Kabushiki Kaisha, Tokyo, Japan

[21] Appl. No.: 719,196

[22] Filed: Jun. 21, 1991

[30] Foreign Application Priority Data

Oct. 25, 1990 [JP] Japan .................. 2-290462

[51] Int. Cl.⁵ .............. H01L 31/072; H01L 31/109; H01L 31/0328; H01L 31/0336
[52] U.S. Cl. ........................ 257/192; 257/190; 257/191; 257/194
[58] Field of Search ............ 357/22 A, 22 MD, 16; 257/190, 191, 192, 194

[56] References Cited

U.S. PATENT DOCUMENTS

| | | | |
|---|---|---|---|
| 4,739,385 | 4/1988 | Bethea et al. | 357/22 A |
| 4,764,796 | 8/1988 | Sasaki et al. | 357/22 A |
| 4,823,171 | 4/1989 | Matsui | 357/22 A |
| 4,827,320 | 5/1989 | Morkoc et al. | 357/22 |
| 4,894,691 | 1/1990 | Matsui | 357/22 A |
| 4,967,242 | 10/1990 | Sonoda et al. | 357/22 A |
| 5,049,951 | 9/1991 | Goronkin et al. | 357/22 A |
| 5,099,295 | 3/1992 | Ogawa | 357/22 A |
| 5,124,762 | 6/1992 | Childs et al. | 257/192 |

FOREIGN PATENT DOCUMENTS

| | | | |
|---|---|---|---|
| 63-102270 | 5/1988 | Japan | 357/22 MD |
| 63-116471 | 5/1988 | Japan | 357/22 A |
| 63-143871 | 6/1988 | Japan | 357/22 A |
| 1-108779 | 4/1989 | Japan | 357/22 A |
| 1-225173 | 9/1989 | Japan | 357/22 A |
| 2-39542 | 2/1990 | Japan | 357/22 A |

OTHER PUBLICATIONS

IEEE Transactions on Electron Devices, vol. 37, No. 6, Jun. 1990, "An AlGaAs/In$_x$Ga$_{1-x}$As/AlGaAs ($0 \leq x \leq 0.5$) Pseudomorphic HEMT on GaAs Substrate Using an In$_{x/2}$Ga$_{1-x/2}$As Buffer Layer", by Maezawa et al., pp. 1416-1421.

IEEE Transactions on Electron Devices, vol. 36, No. 11, Nov. 1989, "Quantum-Well p-Channel AlGaAs/InGaAs/GaAs Heterostructure Insulated-Gate Field-Effect Transistors", by Ruden et al., pp. 2371-2379.

*Primary Examiner*—Rolf Hille
*Assistant Examiner*—Steven Loke
*Attorney, Agent, or Firm*—Leydig, Voit & Mayer

[57] ABSTRACT

A heterojunction field effect transistor includes a semi-insulating crystalline layer, a pseudomorphic channel layer disposed on the semi-insulating crystalline layer, and an electron supply layer disposed on said pseudomorphic layer. The channel layer has a lattice constant equal to or close to that of the semi-insulating crystalline layer adjacent to semi-insulating crystalline layer and different from the semi-insulating crystalline layer adjacent to the electron supply layer.

1 Claim, 5 Drawing Sheets

HETEROJUNCTION FIELD EFFECT TRANSISTOR

The present invention relates to a field effect transistor having a heterojunction therein.

BACKGROUND OF THE INVENTION

A heterojunction field effect transistor takes an advantage of two-dimensional electron gas generated along the interface of the heterojunction for its operation. One known example is a high electron mobility transistor (HEMT).

One example of an HEMT is shown in FIG. 1. The HEMT shown in FIG. 1 is the one disclosed in U.S. Pat. No. 4,827,320. In FIG. 1, on the top surface of a substrate 2 of semi-insulating material, for example, gallium arsenide, GaAs, a channel layer 4 of indium gallium arsenide, $In_yGa_{1-y}As$, is disposed, where y is a value of from 0.1 to 0.25. On the channel layer 4, an electron supply layer 6 of aluminum gallium arsenide doped with silicon, Si, as an impurity, i.e. n+ $Al_xGa_{1-x}As$ (x being a value between 0.05 and 0.20), is disposed. A cap layer 8 of n+ GaAs is disposed on the electron supply layer 6. On the top surface of the cap layer 8, a source electrode 10 and a drain electrode 12 are disposed spaced from each other. Broken lines extending downward from the source and drain electrodes 10 and 12 in FIG. 1 indicate that the metals constituting the electrodes 10 and 12 diffuse so that the electrodes 10 and 12 contact the channel layer 4. A portion of each of the cap layer 8 and the electron supply layer 6 between the source and drain electrodes 10 and 12 is removed, and a gate electrode 14 is disposed there on electron supply layer 6.

In the above-described HEMT, the electron supply layer 6 is depleted due to a band-gap difference $\Delta Ec$ of, for example, about 0.3 eV, between the electron supply layer 6 and the channel layer 4, so that the impurity, Si, in the electron supply layer 6 is ionized. Electrons generated in the electron supply layer 6 by this ionization are stored in the channel layer 4 along the interface with the electron supply layer 6 due to the difference in electron affinities. The stored electrons produce a two-dimensional electron gas channel. In this case, a peak value of the electron concentration in the channel layer 4 is, for example, from $1 \times 10^{12}$ cm$^{-2}$ to $2 \times 10^{12}$ cm$^{-2}$.

When a voltage is applied between the source electrode 10 and the drain electrode 12, the electrons in the two-dimensional electron gas move between the two electrodes 10 and 12 at a high velocity because they are scattered little by dopant impurity. The field effect transistor operation of this HEMT is provided by controlling electrons in the two-dimensional electron gas channel by means of the electric field produced by the gate electrode 14.

In HEMT's as described above, the composition of the channel layer 4 is $In_yGa_{1-y}As$, where y is a value between 0.1 and 0.25, and is different from that of the GaAs layer 2. Accordingly, the channel layer 4 and the GaAs layer 2 have different lattice constants, which causes lattice mismatching between the two layers. This, in turn, causes crystalline defects in the channel layer 4, so that the two-dimensional electron gas mobility decreases, and the performance of the HEMT is degraded. Further, because of the composition of the channel layer 4 being as stated above, the bandgap difference between the channel layer 4 and the electron supply layer 6 cannot be made larger than about 0.3 eV as stated above and, accordingly, the concentration of two-dimensional electrons in the channel layer 4 cannot be increased.

Therefore, an object of the present invention is to provide a heterojunction field effect transistor with little lattice mismatching.

Another object of the present invention is to provide a heterojunction field effect transistor having an increased difference in bandgap between a channel layer and an electron supply layer.

SUMMARY OF THE INVENTION

In order to achieve the above-described objects, according to a first aspect of the present invention, a heterojunction field effect transistor includes a semi-insulating crystalline layer, a pseudomorphic channel layer disposed on the crystalline layer, and an electron supply layer disposed on the channel layer. The channel layer is formed by a plurality of sub-layers which are disposed substantially parallel the electron supply layer and the semi-insulating crystalline layer. At least one of the sub-layers closer to the electron supply layer which is adjacent to the electron supply layer is thin. Further, the thin sub-layers have a lattice constant different from that of the semi-insulating crystalline layer. Thus, closer to the semi-insulating crystalline layer, the sub-layers of the channel layer have lattice constants which are closer or equal to the lattice constant of the semi-insulating crystalline layer.

According to a second aspect of the invention, in the heterojunction field effect transistor as described above, the sub-layer of the channel layer adjacent to the electron supply layer is thin, and has minimum bandgap energy. The sub-layers of the channel layer have increasing bandgap energies as they are closer to the semi-insulating crystalline layer.

According to a third aspect of the invention, a heterojunction field effect transistor includes a semi-insulating crystalline layer, a pseudomorphic channel layer, and an electron supply layer. Instead of forming the channel layer from a plurality of sub-layers, the channel layer comprises a single layer which has a lattice constant gradually changing from a value equal or close to that of the semi-insulating crystalline layer in the semi-insulating crystalline layer side toward the lattice constant of the electron supply layer in the electron supply layer side.

According to still another aspect of the present invention, the bandgap energy of the channel layer of the heterojunction field effect transistor according to the above-described third aspect gradually increases from the electron supply layer side toward the semi-insulating crystalline layer side.

DETAILED DESCRIPTION OF EMBODIMENTS

Figure 1:
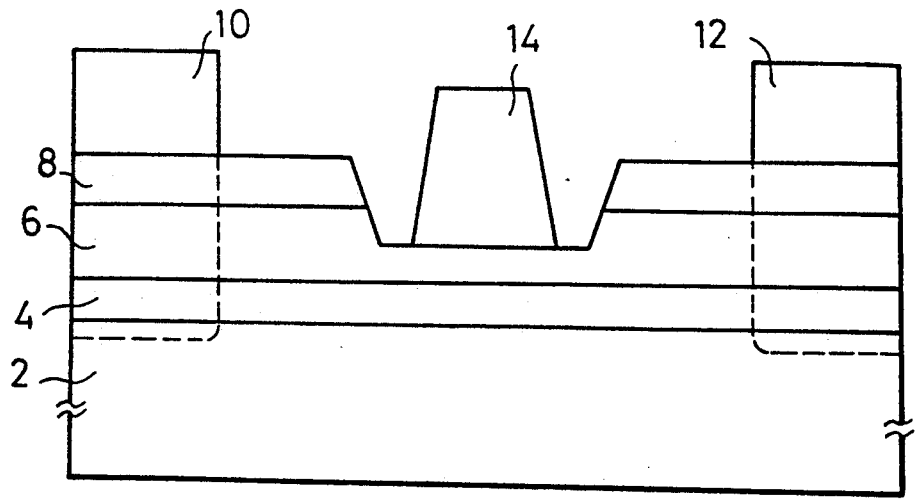
FIG. 1 is a cross-sectional view of a conventional heterojunction field effect transistor.
Figure 2:
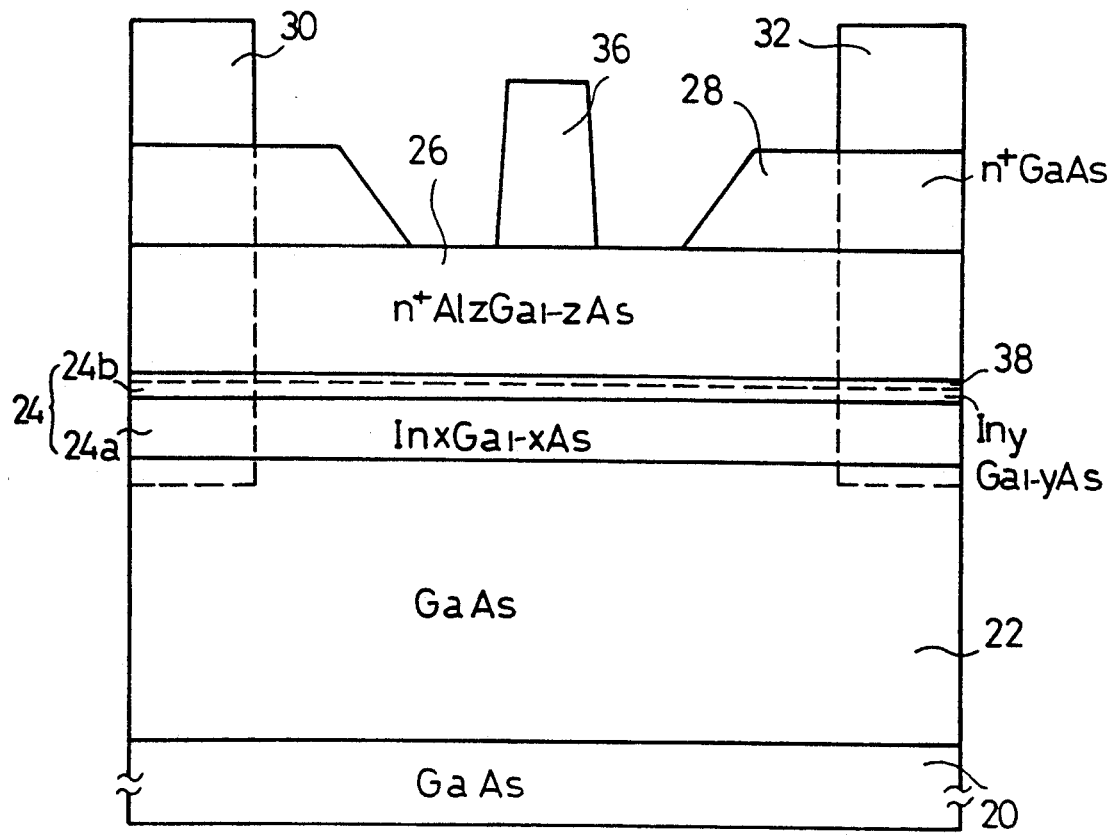
FIG. 2 is a cross-sectional view of a heterojunction field effect transistor according to a first embodiment of the present invention.
Figure 3:
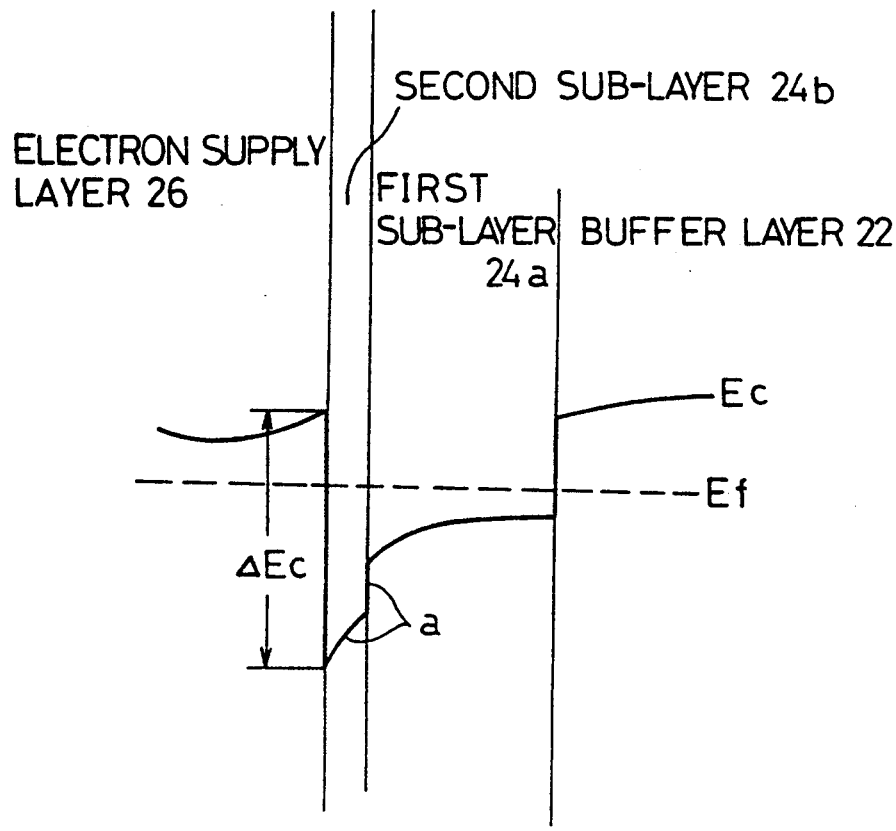
FIG. 3 is an energy band diagram of the heterojunction field effect transistor shown in FIG. 2.
Figure 4:
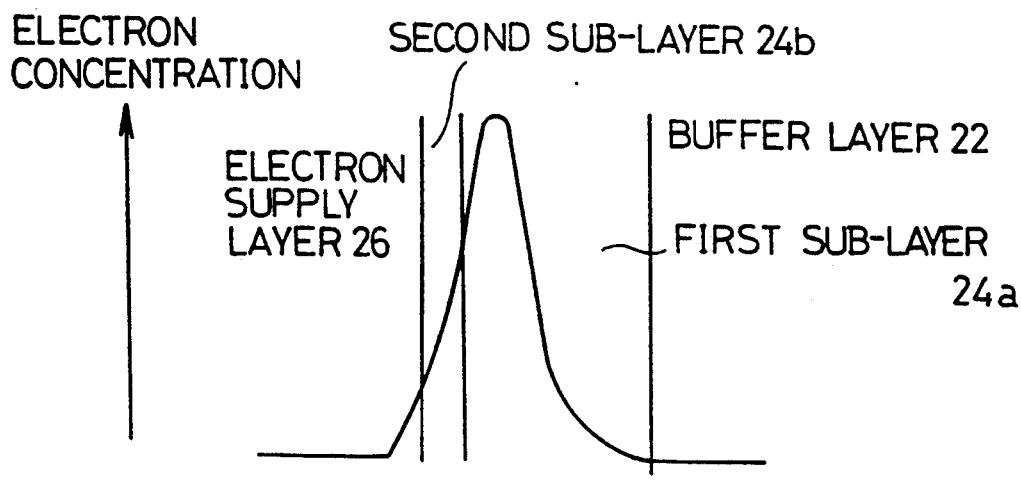
FIG. 4 is a diagram showing the electron concentration distribution of the transistor of FIG. 2.

Referring to FIGS. 2, 3 and 4, the present invention embodied in an HEMT is described. As shown in FIG. 2, the HEMT according to this embodiment includes a semi-insulating crystalline substrate 20 of, for example, GaAs, which ultimately is to be ground to a thickness of, for example, about 130 $\mu$m. An undoped GaAs buffer layer 22 having a thickness of, for example, from about 0.3 $\mu$m to about 2.0 $\mu$m is disposed on the GaAs layer 20. A pseudomorphic channel layer 24 is disposed on the undoped buffer layer 22. The pseudomorphic channel layer 24 includes a first sub-layer 24a and a second sub-layer 24b. The thickness of the channel layer 24 as a whole is less than the critical film thickness and is, for example, about 150 Å. The first sub-layer 24a is $In_xGa_{1-x}As$, where x is a value from 0 to 0.20. The second sub-layer 24b is disposed on the top surface of the first sub-layer 24a and comprises $In_yGa_{1-y}As$, where y is a value from 0.1 to 0.50. The thickness of the second sub-layer 24b is small and is, for example, about 10–100 Å. Accordingly, the thickness of the first channel sub-layer 24a is the thickness of the entire channel layer 24 (i.e. 150 Å in the illustrated embodiment) less the thickness of the second sub-layer 24b.

The value x of the first sub-layer 24a is smaller than the value y of the second sub-layer 24b. In other words, the first sub-layer 24a has a smaller ratio of InAs to InGaAs and a larger ratio of GaAs to InGaAs than the second sub-layer 24b. Accordingly, the first sub-layer 24a has a lattice constant closer to that of the undoped buffer layer 22 and, therefore, is relatively closely lattice-matched with the undoped buffer layer 22. In contrast, the second sub-layer 24b has a larger ratio of InAs to InGaAs and, therefore, has a lattice constant which is closer to that of InAs. Furthermore, because of the higher InAs proportion, the bandgap of the second sub-layer 24b is smaller than that of the first sub-layer 24a.

An electron supply layer 26 is disposed on the top surface of the second channel sub-layer 24b. The electron supply layer 26 is, for example, n+ $Al_zGa_{1-z}As$, where z is, for example, from 0.01 to 0.30 and, preferably, about 0.20. The electron supply layer 26 is doped with, for example, Si in a concentration of about $2 \times 10^{18}$ cm$^{-3}$. The thickness of the electron supply layer 26 is, for example, 450 Å.

On the top of the electron supply layer 26, a cap layer 28 is disposed. The cap layer 28 is of, for example, n+ GaAs doped with, for example, Si in a concentration from about $0.1 \times 10^{18}$ cm$^{-3}$ to about $5 \times 10^{18}$ cm$^{-3}$. The thickness the cap layer 28 is, for example, 2000 Å.

On the top surface of the cap layer 28, a source electrode 30 and a drain electrode 32 are disposed spaced from each other. A portion of the cap layer 28 between the source electrode 30 and the drain electrode 32 is removed, and a gate electrode 36 is disposed on the electron supply layer 26 which is exposed through the removed portion of the cap layer 28.

In the above-described HEMT, as in the conventional HEMT's, the electron supply layer 26 is depleted due to the bandgap difference $\Delta Ec$ between the electron supply layer 26 and the channel layer 24, whereby the dopant impurity in the electron supply layer 26 is positively ionized. Electrons in the electron supply layer 26 are stored in the second channel sub-layer 24b along the interface between the sub-layer 24b and the electron supply layer 26, whereby a two-dimensional electron gas channel 38 is formed.

Because of the composition of the second sub-layer 24b which is $In_yGa_{1-y}As$ (y being a value of from 0.10 to 0.50), the bandgap of the layer 24b is small. As a result, as shown in FIG. 3, the bandgap difference $\Delta Ec$ between the electron supply layer 26 and the second sub-layer 24b is, for example, about 0.4 eV, which is larger than the bandgap difference in the conventional devices. Accordingly, as shown in FIG. 4, the peak value of the electron concentration in the second sub-layer 24b is not less than about $2 \times 10^{12}$ cm$^{-2}$, which is also larger than that of conventional devices. Furthermore, because the potential gradient in the second sub-layer 24b is very steep as indicated by a letter "a" in FIG. 3, a larger effect of confining electrons in the second sub-layer 24b is provided. Lattice mismatching is present between the second sub-layer 24b and the electron supply layer 26, but the influence of the lattice mismatching is negligibly small because the second sub-layer 24b is very thin.

Figure 5:
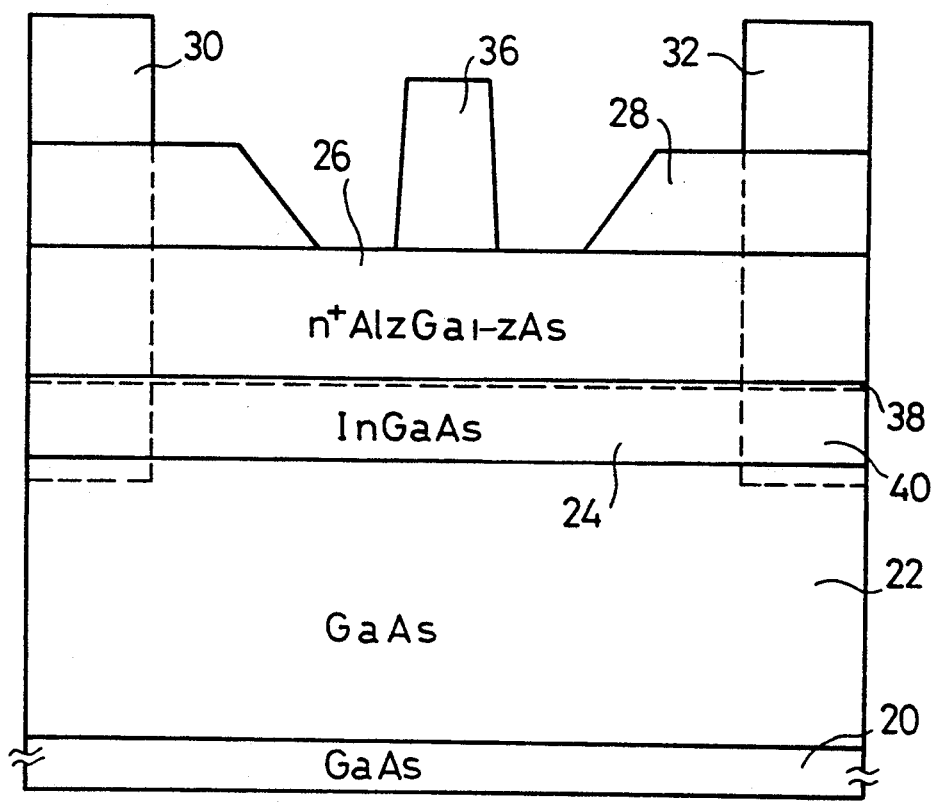
FIG. 5 is a cross-sectional view of a heterojunction field effect transistor according to a second embodiment of the present invention;_
Figure 6:
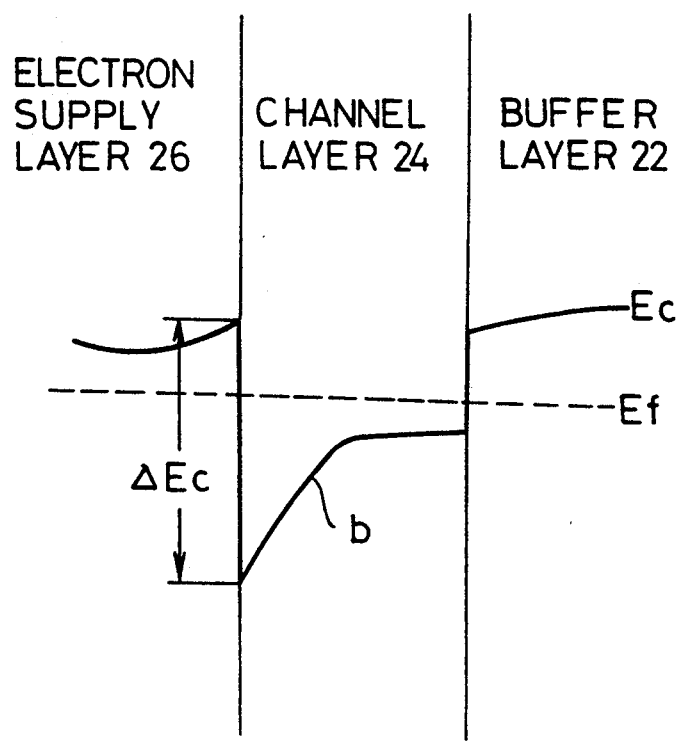
FIG. 6 is an energy band diagram of the transistor of FIG. 5.
Figure 7:
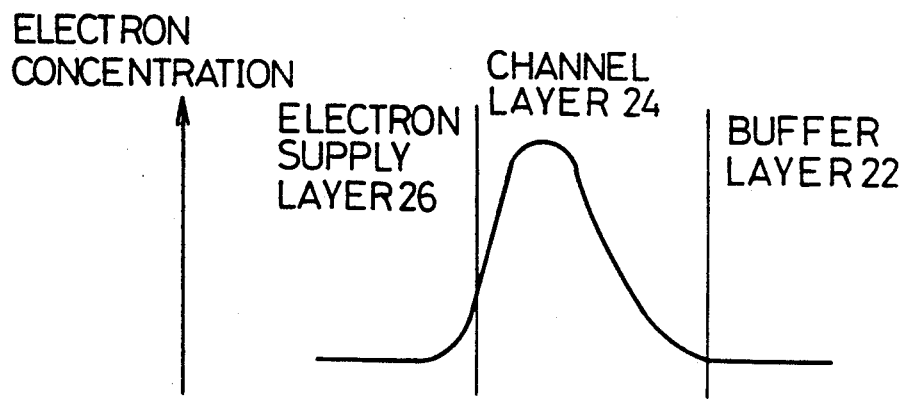
FIG. 7 is an electron concentration distribution diagram of the transistor of FIG. 5.

Next, a second embodiment of the present invention is described with reference to FIGS. 5, 6 and 7. In the aforementioned first embodiment, the channel layer 24 comprises two sub-layers. The device shown in FIG. 5 is identical with that of the first embodiment except that the channel layer 24 comprises a single layer. The channel layer 24 is formed of InGaAs of which the composition gradually varies from the electron supply layer side to the undoped buffer layer side of the layer 24. The channel layer 24 has a value y in $In_yGa_{1-y}As$ of 0.1 to 0.50 in the portion adjacent to the electron supply layer 26, as in the first embodiment. The value of y in the portion adjacent to the undoped buffer layer 22 is from 0 to 0.20. Closer to the buffer layer 22, the value in y of $In_yGa_{1-y}As$ becomes smaller. The thickness of the channel layer 24 is, for example, 150 Å, as in the first embodiment.

Since the remaining elements of the structure shown in FIG. 5 are similar to those of the structure shown in FIG. 2, the same reference numerals are attached to the element and explanation of them is not necessary.

In this second embodiment, too, for the same reason as explained for the first embodiment, the bandgap difference $\Delta Ec$ between the electron supply layer 26 and the portion of the channel layer 24 adjacent to the layer 26 is about 0.4 eV or so, and the peak value of the electron concentration in the channel layer 24 is about $2 \times 10^{12}$ cm$^{-2}$ or more.

Figure 8:
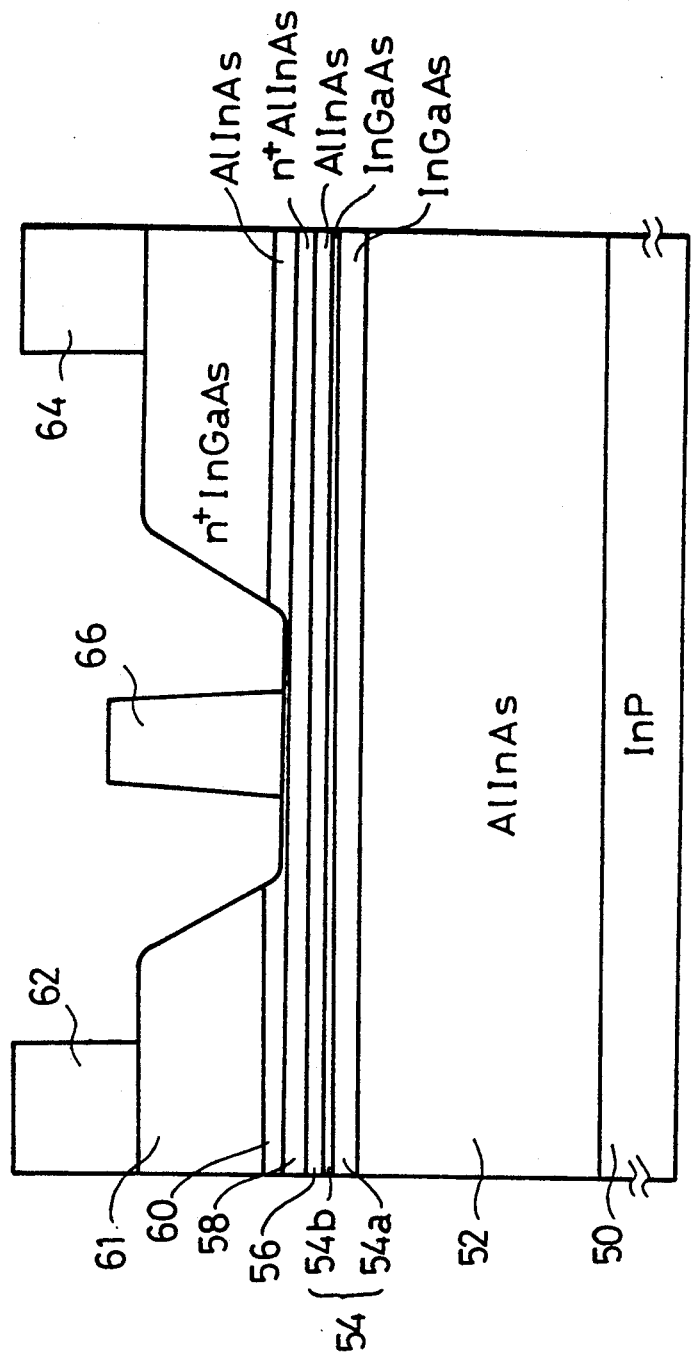
FIG. 8 is a cross-sectional view of a heterojunction field effect transistor according to a third embodiment of the present invention.

FIG. 8 shows a third embodiment. According to this embodiment, the semi-insulating crystal line layer 50 is an InP layer, which has a thickness of, for example, about 1 $\mu$m. An undoped buffer layer 52 is disposed on the InP layer 50. The undoped buffer layer 52 is formed of $Al_{0.48}In_{0.52}As$ and has a thickness of 0.2–1 $\mu$m.

A channel layer 54 is disposed on the undoped buffer layer 52. The channel layer 54 has a thickness of 100–500 Å, and, similar to the first embodiment, comprises a first channel sub-layer 54a and a second channel sub-layer 54b. The first sub-layer 54a is $In_{0.47}Ga_{0.53}As$. The second sub-layer 54b is $In_wGa_{1-w}As$, where w is from 0.50 to 0.70, and is so thin that influence of lattice mismatching is negligible.

A spacer layer 56 of 10-100 Å thickness, for example, is disposed on the second sub-layer 54b. The spacer layer 56 is $Al_{0.48}In_{0.52}As$. On this spacer layer 56, an electron supply layer 58 of $Al_{0.48}In_{0.52}As$ having a thickness of, for example, from 200 Å to 500 Å is disposed. The electron supply layer 58 is doped with, for example, Si in a concentration of the order of, for example, $10^{18}$ cm$^{-3}$.

An $al_{0.48}In_{0.52}As$ layer 60 having a thickness of, for example, from about 200 Å to 1000 Å is disposed on the electron supply layer 58. A Schottky gate electrode 66 is formed on this layer 60 later. A cap layer 61 of, for example, 1000 Å to 2000 Å thickness is disposed on the $Al_{0.48}In_{0.52}As$ layer 60. The cap layer 61 is $In_{0.47}Ga_{0.53}As$ doped with, for example, Si in a concentration of the order of, for example, $10^{17}$ cm$^{-3}$ to $10^{18}$ cm$^{-3}$.

A source electrode 62 and a drain electrode 64 are disposed on the cap layer 61. A portion of the cap layer 61 and a portion of the $Al_{0.48}In_{0.52}As$ layer 60 are removed, and as stated previously, the Schottky gate electrode 66 is disposed on the exposed portion of the $Al_{0.48}In_{0.52}As$ layer 60.

$In_{0.47}Ga_{0.53}As$ and $Al_{0.48}In_{0.52}As$ have lattice constants which match that of InP, i.e. they are lattice-matched with InP. Let it be assumed that the channel layer 54 is formed of a single layer of $In_{0.47}Ga_{0.53}As$. Lattice-matching can be obtained between the channel layer 54 and the undoped buffer layer 52 and between the channel layer 54 and the spacer and electron supply layers 56 and 58. Therefore, no crystalline defects are produced in the channel layer 54 or in the electron supply layer 58, and, accordingly, the mobility of the two-dimensional electron gas in the channel layer 54 is improved. However, the channel layer 54 is formed of a single layer. The bandgap energy of the channel layer 54 is determined by its composition. The bandgap energy of the electron supply layer 58 is also determined by its composition. Accordingly, the bandgap energy difference $\Delta Ec$ between the electron supply layer 58 and the channel layer 54 has a particular limited value, so that the two-dimensional electron gas concentration in the channel layer 54 has also a particular limited value which is dependent on $\Delta Ec$.

As described above, according to the embodiment shown in FIG. 8, the second channel sub-layer 54b is formed $In_wGa_{1-w}As$, where w is a value from 0.50 to 0.70, so that it has bandgap energy smaller than that of $In_{0.47}Ga_{0.53}As$, to thereby provide a larger bandgap difference $\Delta Ec$ between the electron supply layer 58 and the second sub-layer 54b. This larger bandgap difference increases the electron concentration in the two-dimensional electron gas channel produced in the second channel sub-layer 54b along the interface between the layers 54b and 56. Since, the first sub-layer 54a is formed of $In_{0.47}Ga_{0.53}As$ and the second sub-layer 54b is thin, the magnitude of lattice-mismatching between the undoped buffer layer 52 and the channel layer 54 does not adversely affect operation of the HEMT.

Figure 9:
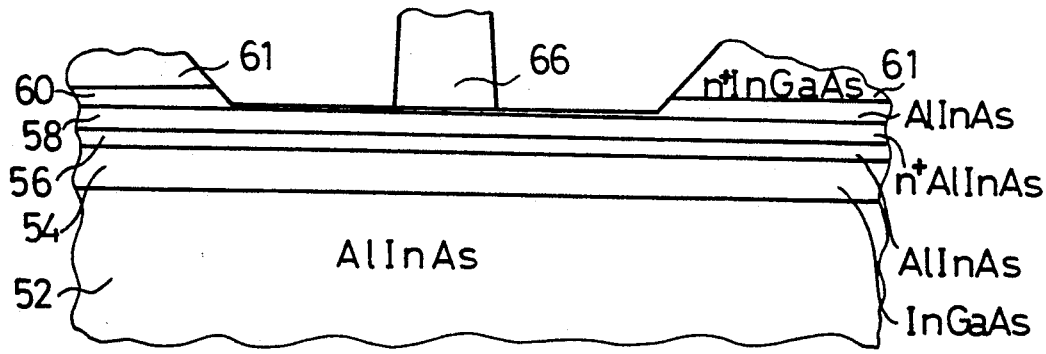
FIG. 9 is a cross-sectional view of a heterojunction field effect transistor according to a fourth embodiment of the present invention.

FIG. 9 shows a fourth embodiment of the present invention. The structure shown in FIG. 9 differs from the one shown in FIG. 8 in that, instead of forming the channel layer 54 with a plurality of sub-layers, a single layer of $In_wGa_{1-w}As$ is used, in which the value of w gradually decreases from a value within a range from 0.50 to 0.70 in the portion adjacent to the spacer layer 56 to a value equal to 0.47 in the portion adjacent to the undoped buffer layer 52.

The HEMT of this embodiment operates in the same manner as that of the third embodiment shown in FIG. 8.

Although the channel layers 24 and 54 of the first and third embodiments of the present invention are described and shown as two sub-layers, the channel layer of the present invention can be formed of more than two sub-layers.

What is claimed is:

1. A heterojunction field effect transistor comprising:
   a semi-insulating indium phosphide crystalline layer;
   a pseudomorphic channel layer having a bandgap energy and disposed on said semi-insulating crystalline layer;
   an AlInAs buffer layer disposed between and contacting said semi-insulating indium phosphide layer and said pseudomorphic channel layer;
   an electron supply layer; and
   a spacer layer of AlInAs interposed between and contacting said pseudomorphic channel layer and said electron supply layer, said pseudomorphic channel layer being $In_wGa_{1-w}As$ adjacent to said electron supply layer, where w is within a range of 0.50 to 0.70, the band gap energy of said pseudomorphic channel layer increasing to a maximum adjacent to said semi-insulating crystalline layer, and said pseudomorphic channel layer being $In_{0.47}Ga_{0.53}As$ adjacent to said semi-insulating crystalline layer.

* * * * *